United States Patent [19]
Brownell et al.

[11] Patent Number: 5,310,363
[45] Date of Patent: May 10, 1994

[54] IMPEDANCE MATCHED REDUCED CROSS TALK ELECTRICAL CONNECTOR SYSTEM

[75] Inventors: Kenneth W. Brownell, Marion; Sterling A. Vaden, Black Mountain, both of N.C.

[73] Assignee: Superior Modular Products Incorporated, Swannanoa, N.C.

[21] Appl. No.: 66,974

[22] Filed: May 25, 1993

Related U.S. Application Data

[63] Continuation-in-part of Ser. No. 855,893, Mar. 23, 1992.

[51] Int. Cl.$^5$ .............................................. H01R 23/02
[52] U.S. Cl. ....................................... 439/676; 439/607
[58] Field of Search ............................. 439/492–499, 439/395, 78, 85, 607, 609, 610, 620, 638–640, 67, 77, 651, 654

[56] References Cited

U.S. PATENT DOCUMENTS

| | | | |
|---|---|---|---|
| 2,667,543 | 1/1954 | Smith et al. | 179/78 |
| 3,757,028 | 9/1973 | Schlessel | 174/33 |
| 4,157,612 | 6/1979 | Rainal | 29/628 |
| 4,418,239 | 11/1983 | Larson et al. | 174/34 |
| 4,551,576 | 11/1985 | Rich | 174/36 |
| 4,698,025 | 10/1987 | Silbernagel et al. | 439/79 |
| 4,831,497 | 5/1989 | Webster et al. | 361/406 |
| 4,878,847 | 11/1989 | Rutledge | 439/74 |
| 5,186,647 | 2/1993 | Denkmann et al. | 439/395 |

FOREIGN PATENT DOCUMENTS

| | | | |
|---|---|---|---|
| 0421174A2 | 4/1991 | European Pat. Off. | |
| 0525703A1 | 2/1993 | European Pat. Off. | |
| 61-256850 | 11/1986 | Japan | 379/332 |
| 2-91987 | 3/1990 | Japan | 439/607 |
| 2-268484 | 11/1990 | Japan | 439/607 |
| 2233157 | 1/1991 | United Kingdom | 439/607 |

*Primary Examiner*—David L. Pirlot
*Attorney, Agent, or Firm*—Carter & Schnedler

[57] ABSTRACT

There is provided an apparatus for reducing pair to pair cross talk which arises in electrical connectors due to closely spaced elongated parallel contacts while maintaining proper longitudinal balance and characteristic impedance of each pair. The cross talk which occurs within the connector is reduced by modifying certain circuit paths either inside or outside of the connector so that each conductor of a first pair which is parallel to and cross talking with an adjacent conductor of a second pair in the connector is relocated adjacent and parallel to the other conductor of the second pair over a predetermined distance. A substantial amount of incident reflected signal, due to impedance mismatch, is reduced by the addition of an additional circuit path, which carries the same signal as one of the relocated conductors of the first pair, at a position adjacent to the other conductor. It is preferred that the relocation of the circuit paths and the additional circuit path occur on a circuit board which is attached to the connector.

22 Claims, 6 Drawing Sheets

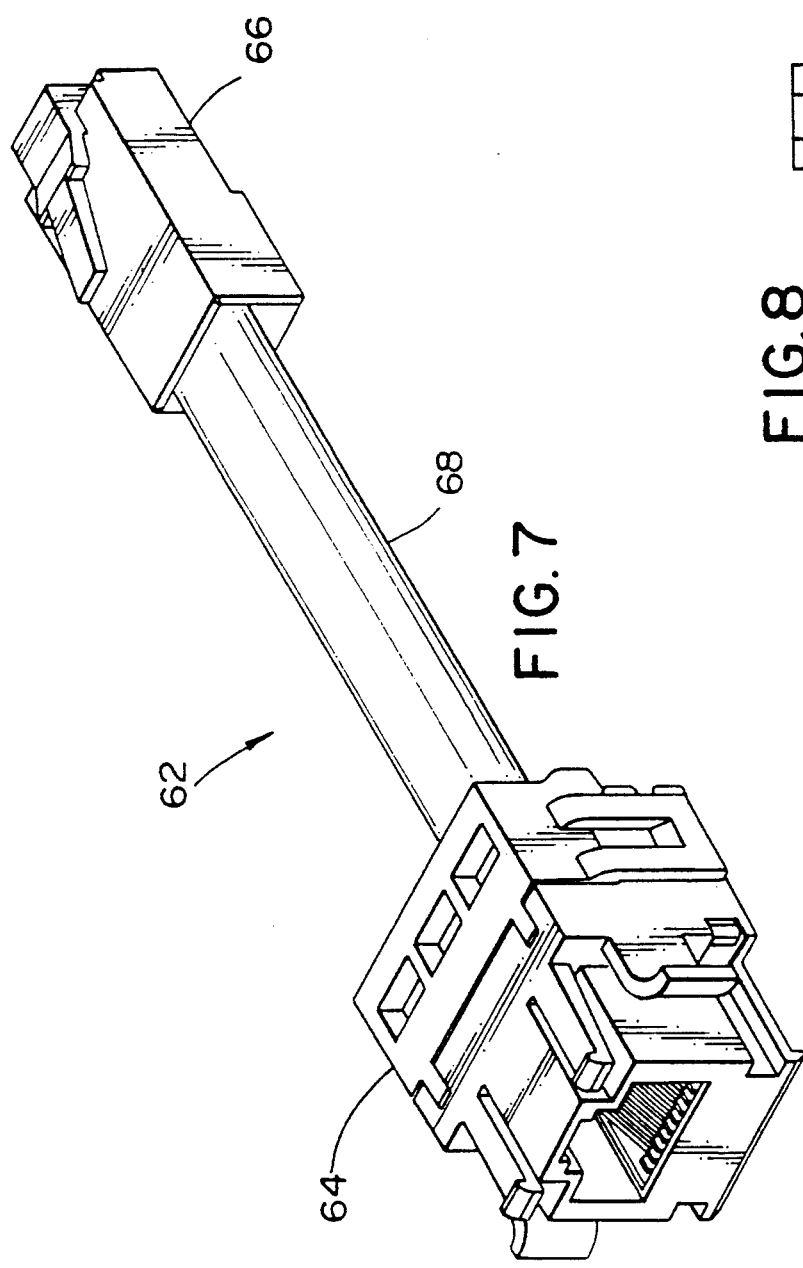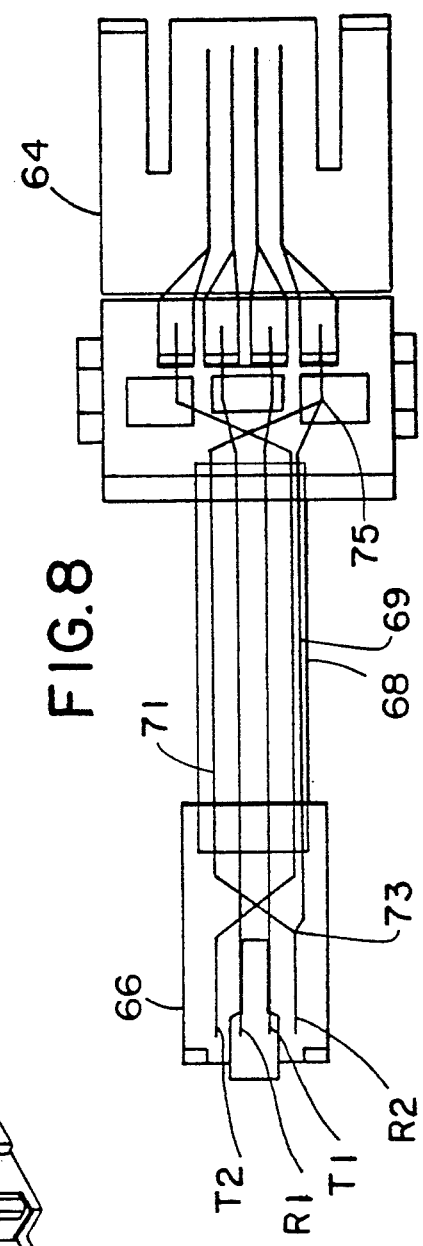

IMPEDANCE MATCHED REDUCED CROSS TALK ELECTRICAL CONNECTOR SYSTEM

RELATED APPLICATION

This is a continuation-in-part of co-pending U.S. patent application Ser. No. 07/855,893, filed on Mar. 23, 1992 by Kenneth W. Brownell and Sterling A. Vaden, titled LOW CROSS TALK ELECTRICAL CONNECTOR SYSTEM and assigned to Superior Modular Products, Inc., assignee of the present application.

BACKGROUND OF THE INVENTION

This invention relates to improving electrical signal transmission for systems having electrical connectors with parallel adjacent contacts. More particularly it relates to the partial cancellation of pair to pair interference or cross talk induced into a signal carrying cable pair by FCC type modular jacks and plugs, or other input/output signal connectors while maintaining proper longitudinal balance and characteristic impedance within the connector system.

The Federal Communications Commission has adopted certain architectural standards with respect to electrical connectors utilized in the telecommunications industry so as to provide intermatability. The connectors most commonly utilized are FCC type modular plugs and jacks. The plug is normally terminated to a cable having a plurality of parallel conductors which may be connected to a telephone handset or other communications device. The conductors are paired and each pair forms a signal loop. Each pair in the cable normally consists of two adjacent twisted conductors. This arrangement in the cable results in certain electrical characteristics of the cable including its characteristic impedance and longitudinal balance. The corresponding jack is commonly mounted to a panel or a printed circuit board which in turn is connected to a telecommunications network. A typical FCC jack is described in U.S. Pat. No. 4,648,478.

Often a plurality of jacks, such as six, are placed adjacent to one another in a housing with the printed circuit board forming the backside of the housing. Each jack includes a plurality of elongated contacts which are closely spaced and parallel to one another. A typical jack having eight adjacent and parallel contacts is shown in FIG. 1. Jack 10 includes electrical contacts 12 which are housed in the hollow portion of the jack and include at least two pairs of parallel contacts. Each pair 14 and 20 form separate communication circuits, each of which will be referred to herein sometimes as a signal pair. Pair 14 includes adjacent conductors 16 and 18 and pair 20 includes conductors 22 and 24 which flank pair 14. Each of these contacts extend through the backside 26 of jack 10 and are soldered to circuit board 28, as shown in FIG. 2. The lengths of the contacts running through the jack are predetermined by connector design considerations.

When an electrical signal of a given frequency is applied to a pair of conductors, an unequal portion of signal energy is transmitted to the individual conductors of an adjacent pair by each conductor of the signal pair. This transmission is primarily due to the capacitive and inductive couplings between adjacent conductors being substantially higher than the couplings of the other conductor of the signal pair resulting in a phenomenon known as cross talk. This phenomena is further exacerbated when both conductors of the signal pair are placed adjacent to and outside of, or flanking, opposing conductors of the other signal pair. For ease of discussion adjacent conductors which are not a signal pair in themselves are referred to herein as a cross-talking pair. For example conductors 16 and 22 form a cross-talking pair and conductors 22 and 24 form a signal pair. The extent of the cross talk is governed by such parameters as the space between the adjacent conductors, the dielectric constant of the material between such conductors and the distance in which such conductors are closely spaced and parallel to one another. Furthermore, the extent of the cross talk is a function of the frequency of the signal on either or both of the signal pairs. Cross talk increases logarithmically as the frequency of the signal increases and is commonly expressed as 10 × log of the ratio of the cross talk energy divided by the signal energy (decibels or dB).

As FCC modular plugs and jacks are utilized more and more in high frequency data and communication applications, cross talk which arises in the adjacent and parallel contacts of the jack, and to a lesser degree in the plug, has become a problem in the industry. Furthermore, because of miniaturization as well as FCC rules, these jacks are quite small resulting in a very close spacing of the contacts which worsens the problem.

A current industry standard permits no more than −56 dB of near end cross talk at 16 Megahertz (MHz). Using good prior art design techniques, such as that shown in FIG. 3, one is able to reach −50 dB of cross talk at 16 MHz utilizing a commonly available modular plug and jack combination. Many designers believe that the routings of the individual circuit paths forming a single signal pair on the circuit board should generally be parallel to each other and the signal pairs should be separated from other pairs as much as possible and be non-parallel to them. That type of design technique on the circuit board does nothing to reduce the cross talk which arises within the connector which is attached to the circuit board but simply, at best, maintains the status quo.

It has been found that cross talk coupling induced by the modular plug and jack interface can be reduced to a great extent by judicious placement of conductors after they exit the modular jack so as to induce signals of opposite phase to those which were induced inside the plug and jack. In the case where the exit from the modular jack is to a printed circuit board, this conductor placement can be effected by using routing methods so as to insure consistent performance in the mass produced part. To decrease cross talk, the circuit traces that form both pairs should be routed in a pattern that is opposite in polarity to the pattern that produces cross talk in the jack and plug. Thus, a positive polarity signal that is induced in the jack is reduced by a negative polarity signal induced by traces on the printed circuit board. It has been demonstrated that improvement in cross talk may be obtained by utilizing this technique to cancel cross talk induced between pairs 1 and 2 of a four pair plug and jack interface wired according to the E.I.A.- A Standard. This wiring standard requires pair 2 to straddle pair 1 causing poor cross talk. The routing pattern of the circuit board places the traces of pair 2 on opposite sides of the corresponding conductors of pair 1 as to which they were positioned inside a plug and jack, thus increasing opposing polarity coupling and thereby reducing the net induced cross talk. The above-described technique of cross talk reduction is described and claimed in U.S. patent application Ser. No. 07/855,893, filed Mar. 23, 1992 by Kenneth W. Brownell and Sterling A. Vaden, titled Low Cross Talk Electrical Connector System, which application is assigned to Superior Modular Products, Inc., assignee of the present application. U.S. application Ser. No. 07/855,893 is incorporated herein by reference.

It has been found that by utilizing the cross talk reduction techniques as set forth above, while having a desirable effect on the reduction of cross talk, the rerouting on the circuit board contributes to an impedance mismatch of the entire transmission system, including the cable, connector, and printed wiring board, thereby negatively affecting structural return loss, voltage standing wave ratio, and combined system attenuation. Table 1, set forth below, shows near end cross talk (NEXT) performance and structural return loss (RETURN LOSS) for two similar sample board assemblies. Assembly 100067 REV P1 utilizes strictly prior art paired traces on the circuit board 30, as shown in FIG. 3, while Assembly 100067 REV B utilizes split pairs, as shown in FIG. 5, which is the subject matter of U.S. patent application Ser. No. 07/855,893.

TABLE 1

| TABLE 1A | | |
|---|---|---|
| PAIRS | NEXT 100067 REV P1 | NEXT 100067 REV B |
| 1-2 | −55.5 dB | −65.2 dB |
| 1-3 | −59.1 | −57.3 |
| 1-4 | −63.2 | −62.8 |
| 2-3 | −74.6 | −78.5 |
| 2-4 | −63.8 | −60.1 |
| 3-4 | −62.3 | −67.3 |

| TABLE 1B | |
|---|---|
| RETURN LOSS 100067 REV P1 | RETURN LOSS 100145 REV B |
| PAIR 1 −38.1 dB | PAIR 1 −37.1 dB |
| PAIR 2 −34.8 | PAIR 2 −28.0 |
| PAIR 3 −38.0 | PAIR 3 −36.7 |
| PAIR 4 −35.8 | PAIR 4 −36.1 |

Table 1 refers to next pairs 1-2 (Table 1A) and return loss for pair 2 (Table 1B). It is clear that the return loss is substantially improved for pair 2 in the REV P1 sample where parallel runs are utilized when compared to a split pair. This parallel routing, however, limits the amount of cross talk reduction that can be effective in a given board length or area because only one conductor of each pair is in close proximity with the other crosstalking conductors. Thus, pair 1-2 cross talk improvement is further enhanced when the pairs are split, however, return loss is worsened in pair 2. In the embodiments set forth above, pair 1 is the innermost pair, pair 2 flanks pair 1, and pairs 3 and 4 are the two outermost pairs. A schematic of a prior art paired routing of 100067 REV P1 is shown in FIG. 3 with pair 1 indicated as 31 and pair 2 indicated as 33. A schematic of 100067 REV B showing a split paired routing as taught in U.S. application Ser. No. 07/855,893 is shown in FIG. 6 with pair 1 being represented as 35 and pair 2 represented as 37.

It is therefore desirable to reduce cross talk without sacrificing return loss.

OBJECTS OF THE INVENTION

It is therefore one object of this invention to provide a low cross talk low loss electrical signal transmission system.

It is another object to provide an apparatus for cancelling cross talk which arises within an electrical connector having closely spaced parallel contacts while maintaining the proper characteristic impedance and longitudinal balance.

It is another object to provide an electrical connector apparatus which is able to equal or exceed pair to pair cross talk standards without substantial signal transmission loss or substantial signal reflection.

SUMMARY OF THE INVENTION

In accordance with one form of this invention there is provided a low cross talk low loss electrical signal transmission system including an electrical connection apparatus having at least first, second, third and fourth conductors with the first and second conductors forming a first signal pair and the third and fourth conductors forming a second signal pair. The first and second pairs are adjacent and parallel to one another through a major portion of the connector apparatus. The third conductor is adjacent and parallel to the first conductor and the fourth conductor is adjacent and parallel to the second conductor through at least a portion of the connection apparatus forming a first path length thereby inducing cross talk from one signal pair to another signal pair when signals are applied to either one of the said pairs. The third conductor is routed adjacent to and parallel to the second conductor and away from the first conductor and the fourth conductor is routed adjacent and parallel to the first conductor and away from the second conductor through another portion of the connector apparatus forming a second path length and thereby cancelling a substantial amount of cross talk which was induced in the first path length of the connector apparatus. A fifth conductor is located in the second path length and is connected to the third conductor. The fifth conductor is adjacent to the fourth conductor.

It has been found that by using this technique both (a) cross talk and (b) reflected energy and system attenuation are substantially reduced. The crossing of the conductors results in a cancellation of a substantial portion of the cross talk which was induced within the connector and the addition of the fifth conductor maintains the proper characteristic impedance and longitudinal balance.

It is preferred that the connector apparatus include a connector housing and a substrate with the first path length being located inside the connector housing and the second path length being located on the substrate. It is further preferred that the substrate be a circuit board.

The spacing between adjacent conductors on the substrate may be adjusted depending on the differences between the dielectric constants within the connector and the dielectric constants on the substrate and space restrictions on the circuit substrate which may also cause physical path length to be reduced or lengthened.

BRIEF DESCRIPTION OF THE DRAWINGS

The subject matter which is regarded as the invention is set forth in the appended claims. The invention itself, however, together with further objects and advantages thereof may be better understood in reference to the following description taken in conjunction with the accompanying drawings in which:

FIG. 7 is a pictorial view showing a jumper which may be used between a jack and a plug in another embodiment of the invention;

FIG. 8 is a top view of FIG. 7, with portions removed, illustrating the configuration of the conductors within the cable;

DESCRIPTION OF THE PREFERRED EMBODIMENTS

Figure 1:
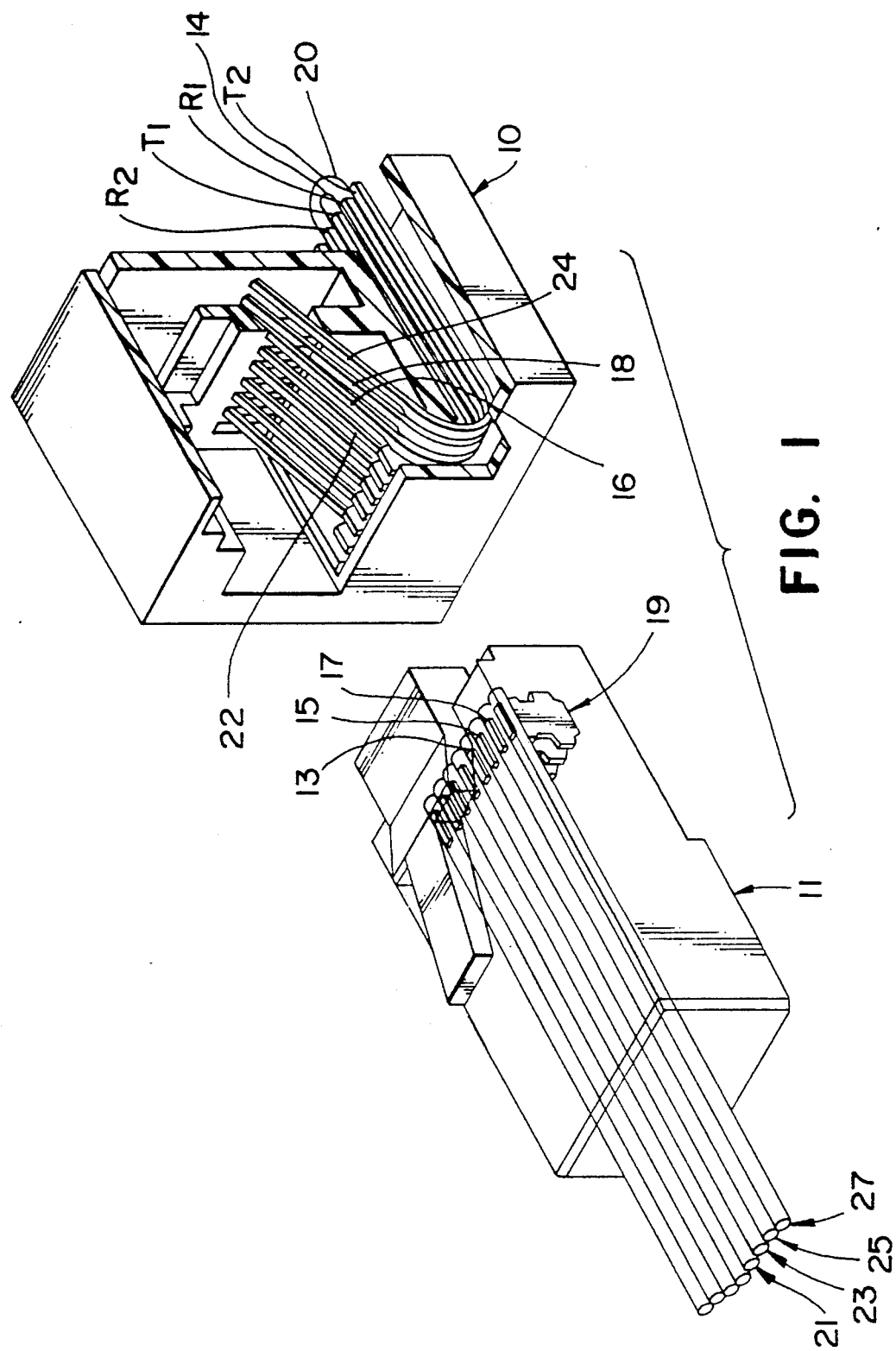
FIG. 1 is a pictorial view showing portions of a typical FCC modular jack and its associated plug and illustrating their closely spaced parallel contacts and conductors.

Referring now to FIGS. 1 through 9, there is provided modular jack 10 including an array 12 of closely spaced parallel electrical contacts. For simplification there are only two signal pairs described, namely pair 14 and pair 20. For ease of illustration, the two pairs are shown on the right side of the jack, however, normally these pairs would be in the central part of the jack. Signal pair 14 includes the central two conductors 16 and 18 of the array and signal pair 20 includes conductors 22 and 24 which flank signal pair 14. Conductors 16 and 18 are also referred to as tip (T) and ring (R) conductors of the signal pair 14 and conductors 22 and 24 form the tip (T) and ring (R) conductors of signal pair 20. For ease of understanding, the entire circuit path which includes contacts, conductors and circuit board tracings are sometimes referred to herein as (T) or (R). Although only two pairs of conductors are specifically described, normally four pairs of conductors are provided within the same jack, as illustrated in FIG. 1.

The associated modular plug having closely spaced and parallel contacts 13, 15, 17 and 19 and conductors 21, 23, 25, and 27 is also shown in FIG. 1. Because of the spacing requirements of the contacts and conductors within the jack and plug, a substantial amount of pair to pair cross talk is introduced. Primarily there is substantial cross talk between conductor 18 and conductor 24 (one cross talking pair) and between conductor 16 and conductor 22, (another cross talking pair). In addition the adjacent contacts and conductors of each signal pair in the plug 11 introduces cross talk.

Figure 3:
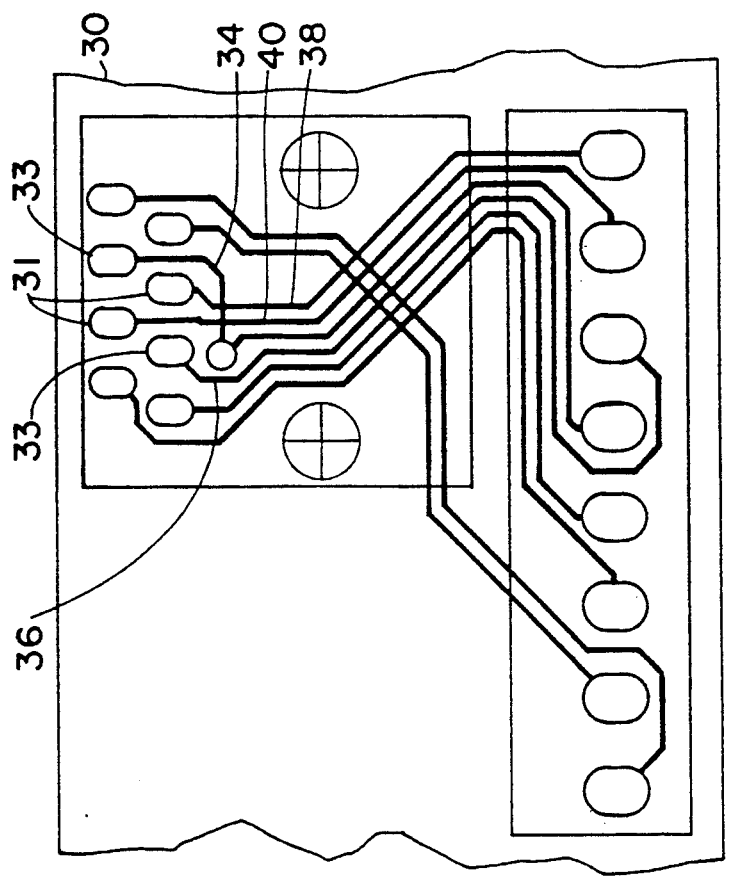
FIG. 3 is a simplified top view of the tracing on the circuit board substantially using parallel tracing design techniques.
Figure 2:
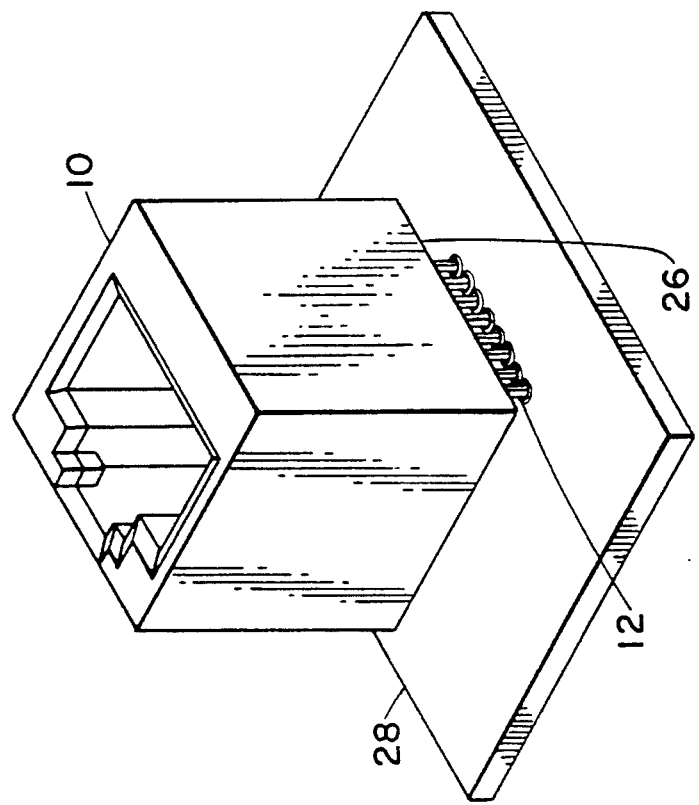
FIG. 2 is a view of the jack of FIG. 1 showing the jack connected to a circuit board.
Figure 5:
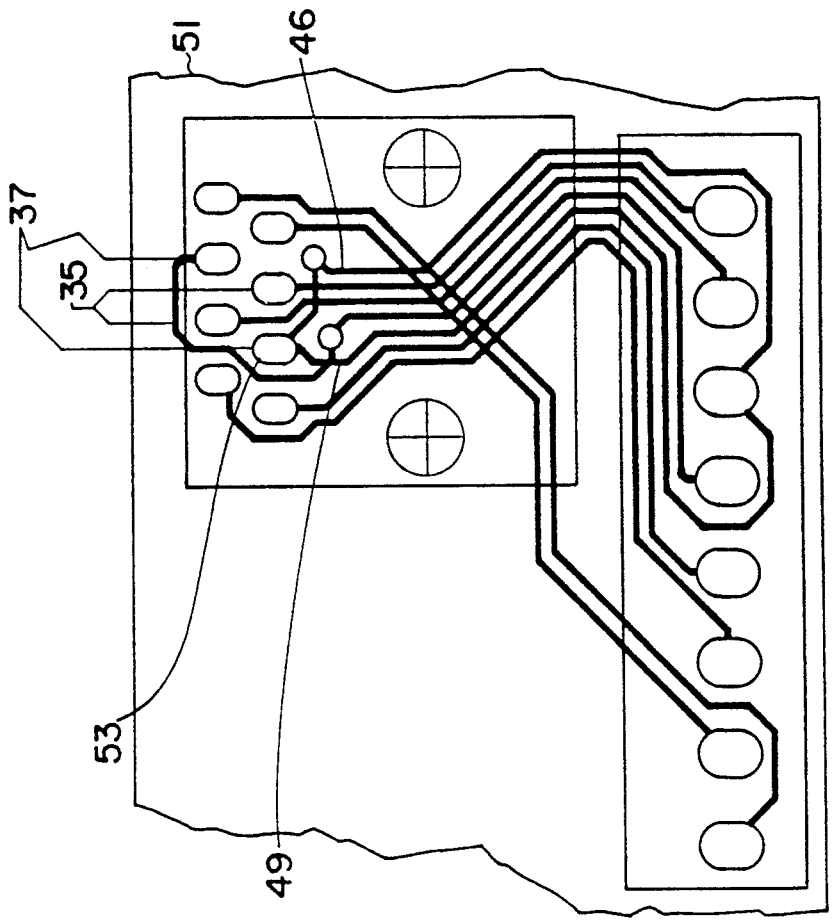
FIG. 5 is a simplified top view of the apparatus of FIG. 2 showing the contacts in the jack and the tracings on the circuit board in accordance with the invention.
Figure 4:
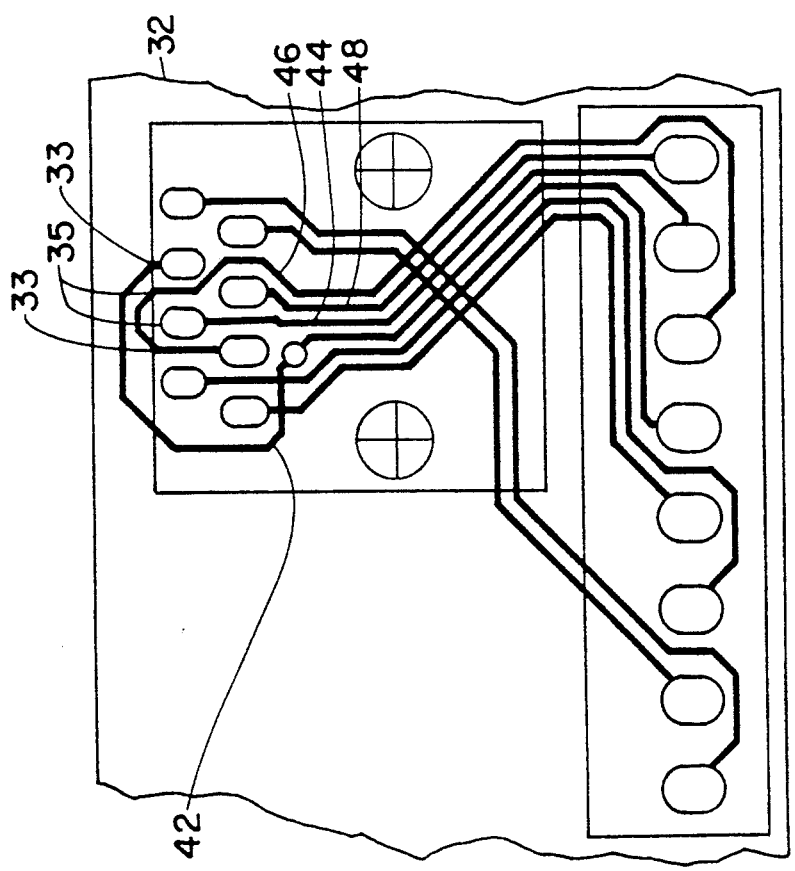
FIG. 4 is a simplified top view of the tracings on the circuit board in accordance with the teachings of U.S. patent application Ser. No. 07/855,893, filed Mar. 23, 1992.

The tails of contacts 12 are soldered to a substrate such as a circuit board indicated generically as 28, as shown in FIG. 2. The circuit board of the prior art design, as shown in FIG. 3, is indicated as board 30. The circuit board of the design of U.S. patent application Ser. No. 07/855,893, filed Mar. 23, 1992, as shown in FIG. 4, is indicated as board 32. The circuit board using the design of one embodiment of this invention, as shown in FIG. 5, is indicated as board 51. In using the prior art design shown in FIG. 3, it was believed that the tracings on the circuit board, which continues the circuit paths of the contacts, should be structured so that cross talk does not increase beyond what occurred within the connector body. Thus tracing 34 forming part of (R2) was placed adjacent and parallel to tracing 36 (T2), and tracing 38 (T1) and tracing 40 (R1) Were placed adjacent and parallel to one another.

As described in U.S. patent application Ser. No. 07/855,893, filed Mar. 23, 1992, cross talk induced within the plug and jack connectors because of the closely spaced parallel conductors may be substantially reduced by changing the tracings on the circuit board so that rather than isolating the signal pairs, each cross talking conductor path in one signal pair is placed adjacent to the opposite conductive path of the other signal pair and the cross talk is substantially cancelled by cross talk energy which is effectively 180 degrees out of phase with the cross talk energy induced by the plug and jack connectors. The conductive paths of one signal pair are referred to as T1 and R1 and the conductor paths of the second signal pair are referred to as T2 and R2. Inside the connector bodies 10 and 11 T1 is adjacent to R2 (cross talking pair) and T2 is adjacent to R1 (cross talking pair). As shown in FIG. 4, by placing T2 adjacent to T1 and away from R1, and R2 adjacent to R1 and away from T1 on the circuit board 32, a substantial amount of the cross talk which occurred within connector bodies is cancelled. Tracing 42 (which is R2) runs adjacent to tracing 44 (which is R1) and away from tracing 48 (which is T1), and tracing 46 (which is T2) runs very close to tracing 48 (which is T1) and away from tracing 44 (which is R1).

As previously discussed in reference to Table 1, substantial reductions in cross talk were realized utilizing the embodiment shown in FIG. 4, however, it was found that by using such technique shown in FIG. 4, structural return loss became higher because of the impedance mismatch between the connector system and the cable. Those losses are also shown in Table 1B.

Referring more particularly to FIG. 5, Applicant has found that one is able to reduce cross talk using the above described conductor crossing techniques without sacrificing return loss gains by adding an additional conductor 49 to circuit board 51. Conductor 49 carries the same signal as conductor 46, which is one of the conductors which is crossed. That is, the identical signal on conductors 46 and 49 travels on two simultaneous paths. The signal on conductor 49 provides proper pair balance and impedance and the signal on conductor 46 provides increased coupling with the opposite conductor of the pair for cross talk reduction. It has further been found that this extra path has the greatest effect when routed completely, i.e., forming a loop from input pin 53 to output pin 55.

Table 2, set forth below, compares the cross talk performance and loss for connector 100067 REV B, which uses the split pair technique of U.S. patent application of 07/855,893, filed Mar. 23, 1992, which is shown in FIG. 4, with that of 100145 REV B, which uses the two simultaneous path techniques of the subject invention, which is shown in FIG. 5.

TABLE 2

| TABLE 2A | | |
|---|---|---|
| PAIRS | NEXT 100067 REV B | NEXT 100145 REV B |
| 1-2 | −65.2 dB | −64.1 dB |
| 1-3 | −57.3 | −60.2 |
| 2-3 | −78.5 | −69.7 |
| 1-4 | −62.8 | −62.0 |

TABLE 2-continued

| | | |
|---|---|---|
| 2-4 | −60.1 | −64.5 |
| 3-4 | −67.3 | −69.8 |

TABLE 2B

| RETURN LOSS 100067 REV B | RETURN LOSS 100145 REV B |
|---|---|
| PAIR 1 −37.1 dB | PAIR 1 −46.6 dB |
| PAIR 2 −28.0 | PAIR 2 −42.6 |
| PAIR 3 −36.7 | PAIR 3 −43.8 |
| PAIR 4 −36.1 | PAIR 4 −41.8 |

It should be noted that the cross talk results are comparable between these two connector systems (see Table 2A, pair 1-2) but the pair 2 return loss (Table 2B) measurement is substantially improved over that of the other pairs for 100145 REV B.

In both Tables 1 and 2, the numbers are given i −dB, therefore, the more negative the number, the better the results, both in terms of return loss and near end cross talk. The equipment used to measure the cross talk and return loss was a Hewlett Packard 4195A Network Analyzer with an internal tracking generator coupled to the device under test through two Northhills Wide Band Balancing Transformers (322BS). Testing was performed in accordance with E.I.A./T.I.A. specification 568, Section 12.2.6.2, titled *Transmission Requirements and Technical Systems Bulletin TSB 40*.

FIGS. 7 and 8 show an alternative embodiment of the invention. Rather than provide modifications to routing techniques on a circuit board by reversing and closely spacing the cross talking conductors adjacent to one another and providing an additional path for one of the routings, a jumper 62 is provided which includes an FCC modular jack 64 and an FCC modular plug 66. A substrate is connected between the jack 64 and plug 66. In this embodiment, cable 68 connects the jack 64 to plug 66. Plug 11, of FIG. 1, is connected to jack 64, and plug 66 is connected to jack 10, also of FIG. 1, thereby forming a jumper between plug 11 and jack 10.

The conductors within cable 68 are illustrated in FIG. 8. Again the positions of the R2 and T2 paths are reversed in the cable so as to cancel the cross talk induced in plugs 11 and 66 and jacks 10 and 64. The length L of the reversed conductors should approximate the lengths of the contacts and conductor in the plugs and jacks, again depending on the dielectric constants and the spacing. It has been found in this embodiment as well as the other embodiments of this invention that by reversing the cross-talking paths a substantial cross talk reduction is achieved. For maximum cross talk cancellation, the length of the jumper and spacing between conductors should be adjusted and held as closely as possible to design dimensions. In addition, a fifth conductor 69 is connected to conductor 71 at 73 within plug 66 and at 75 within jack 64 to reduce attenuation and return loss.

The device shown in FIGS. 7 and 8 may be utilized in retrofit applications so that new circuit boards need not be manufactured.

Figure 6:
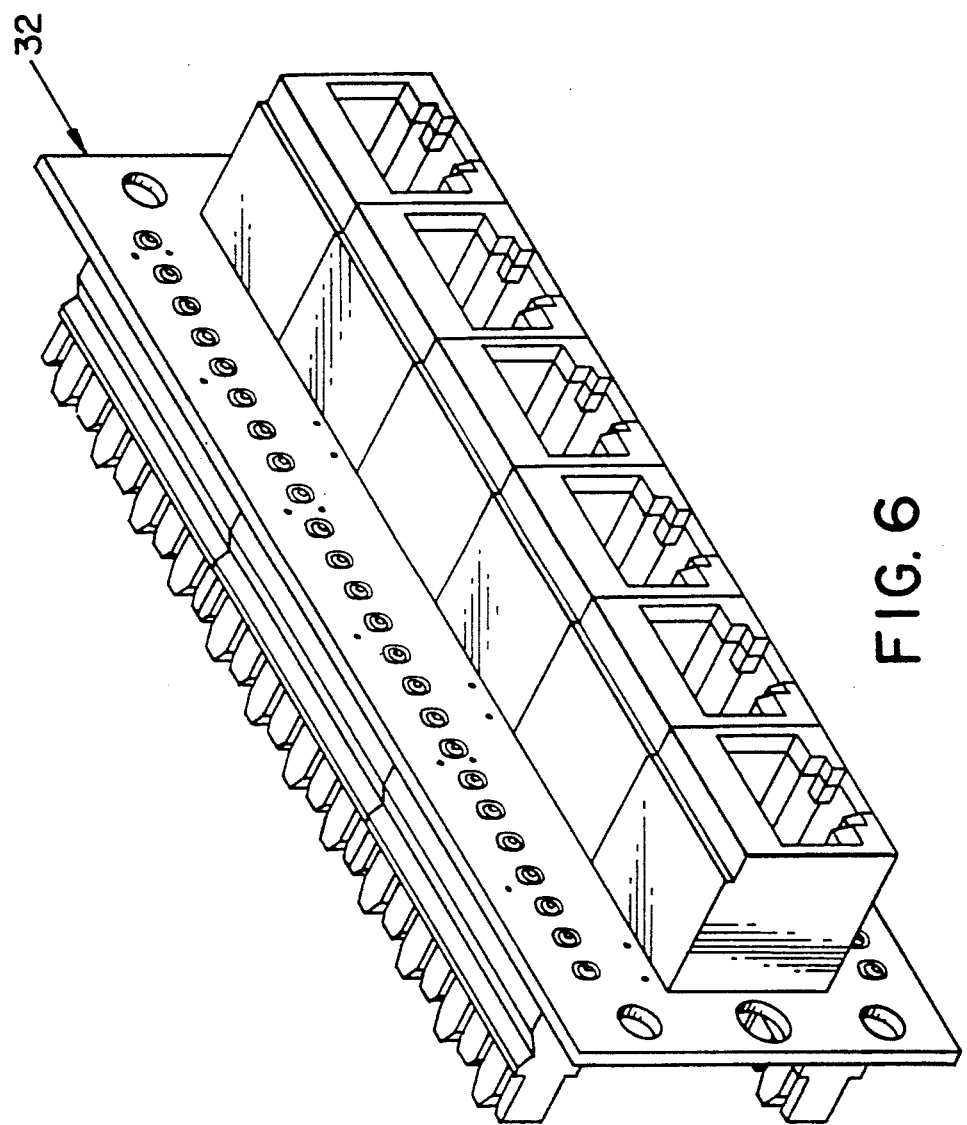
FIG. 6 is a pictorial view of a typical connector having six modular jacks connected to a circuit board in which the invention may be utilized.
Figure 9:
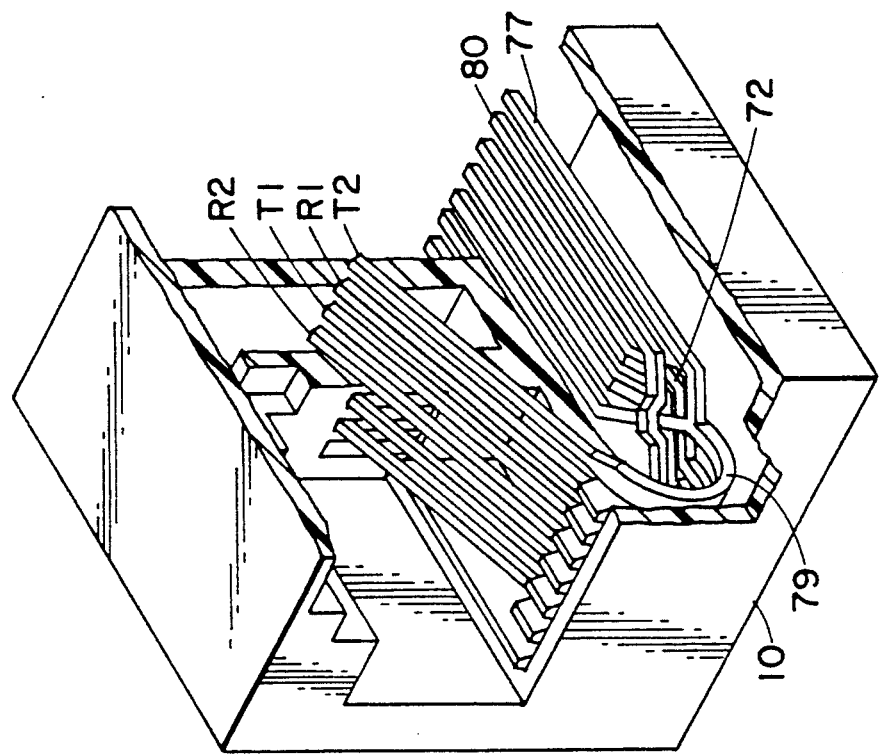
FIG. 9 is a pictorial view showing an array of jack contacts within a jack illustrating yet another embodiment of the invention.

FIG. 9 shows still another embodiment of the invention whereby the conductor array 72 within jack housing 10 is modified by again crossing T2 and R2 paths and adding contact 77, which is connected to contact 79 (T2), in a similar fashion, as shown in FIGS. 6 and 8. A major portion of contact 79 is adjacent and parallel to contact 80. By using this embodiment, the circuit board 28 need not be modified. That is, the prior art circuit board 30, shown in FIG. 3, may be utilized and one may still achieve a cancelling of cross talk which is both induced and cancelled within connector 10 without the impedance mismatch problem.

Applicant has thus provided a technique for reducing cross talk arising in FCC type modular jacks and plugs and other signal connectors by taking advantage of the cross talk itself, that is, by reversing the position of the tip (T) and ring (R) conductors in adjacent pairs so that each conductor of a first pair which was originally cross talking with a conductor of the second pair is placed adjacent and parallel to the other conductor of the second pair and away from its original conductor for a certain distance by changing the circuit paths either on a substrate such as a circuit board, in a jumper, or within the housing of the connector itself while at the same time maintaining proper characteristics impedance match by adding another conducting path for one of the conductors.

From the foregoing description of the preferred embodiments of the invention, it will be apparent that many modifications may be made therein. It is to be understood that all such modifications are embodied in the accompanying claims which come within the true spirit and scope of this invention.

We claim:

1. A low cross talk electrical signal transmission system comprising:
    an electrical connection apparatus having at least first, second, third and fourth conductors; said first and second conductors forming a first signal pair; said third and fourth conductors forming a second signal pair; said first and second conductors being adjacent to and parallel to one another through at least a major portion of said electrical connection apparatus; said third conductor being adjacent to and parallel to said first conductor and said fourth conductor being adjacent to and parallel to said second conductor through at least a portion of said connector apparatus thereby forming a first group of signal paths thus inducing cross talk from one signal pair to another signal pair when signals are applied to either of said signal pairs; said third conductor being adjacent to and parallel to said second conductor and said fourth conductor being adjacent to and parallel to said first conductor for another portion of said connector apparatus forming a second group of signal paths, thereby cancelling a substantial amount of said cross talk; a fifth conductor connected to said third conductor and being adjacent to said fourth conductor in said second group of signal paths thereby improving return, loss.

2. A system as set forth in claim 1 wherein said connection apparatus includes a jack; said first group of circuit paths and said second group of circuit paths and said fifth conductor are housed within said jack.

3. A system as set forth in claim 1 wherein the length of said second group of circuit paths is substantially the same length as said first group of circuit paths.

4. A system as set forth in claim 1 wherein said connection apparatus includes a connector and a substrate.

5. A system as set forth in claim 4 wherein said first group of signal paths is located within said connector housing; said second group of signal paths being located on said substrate.

6. A system as set forth in claim 3 wherein said substrate is a circuit board.

7. A system as set forth in claim 1 wherein said connector apparatus includes a first jack and a jumper including a second jack, a plug and a substrate connected between said second jack and said plug; said substrate having said second group of circuit paths.

8. A system as set forth in claim 7 wherein said substrate is a cable.

9. A low cross talk electrical signal transmission system comprising:

at least four conductive paths formed by a first pair of conductors and a second pair of conductors; each pair of conductors being a part of a separate electrical circuit for conducting separate electrical signals;

an electrical connector; first portions of each of said conductive paths being through said connector; said conductive paths being substantially parallel to one another through at least a part of said connector thereby causing pair to pair signal interference when an electrical signal is on at least one of said pairs;

apparatus for reducing the pair to pair signal interference;

said apparatus for reducing including a rearrangement of a second portion of at least one of said conductive paths resulting in the cancellation of a substantial amount of said interference;

apparatus for reducing structural return loss;

each pair includes a first and a second conductor; said first conductor of said first pair is adjacent to said second conductor in said second pair, and said second conductor of said first pair is adjacent to said first conductor in said second pair for the length of said conductive paths within said connector; said first conductor of said first pair is adjacent to said first conductor of said second pair, and said second conductor of said first pair being adjacent to said second conductor of said second pair for the length of said conductive paths within said apparatus for reducing interference; said apparatus for reducing return loss being a fifth conductor connected to said second conductor of said second pair and located adjacent to said first conductor of said second pair within said apparatus for reducing interference.

10. A signal transmission system as set forth in claim 9 further including a substrate attached to said connector; said rearrangement of said second portion of at least one conductive path and said apparatus for reducing return loss being on said substrate.

11. A system as set forth in claim 10 wherein said substrate is a circuit board.

12. A system as set forth in claim 10 wherein said substrate is a cable.

13. An electrical connector system comprising:

a connector having at least four parallel adjacent contacts; two of said contacts being inner contacts and forming a first conductive pair; two other contacts adjacent to said inner contacts on the outside thereof forming a second conductive pair;

a carrier; said carrier including four conductors; each conductor respectively connected to one of said contacts; said first contact of said first pair connected to said first conductor of said first pair; said second contact of said first pair connected to said second conductor of said second pair; said first contact of said second pair connected to said first conductor of said second pair; said second contact of said second pair connected to said second conductor of said second pair;

for a substantial portion of the length of said carrier said first conductor of said second pair is adjacent to said second conductor of said first pair, and said second conductor of said second pair is adjacent to said first conductor of said first pair whereby pair to pair interference is substantially reduced in said system; said carrier including a fifth conductor; said fifth conductor connected to said first conductor of said second pair; said fifth conductor being adjacent to said second conductor of said second pair for improving characteristic impedance match within the complete system.

14. A system as set forth in claim 13 wherein said carrier is a circuit board.

15. A system as set forth in claim 13 further including a plug having at least four adjacent contacts and at least four parallel conductors; the length of said conductors on said substantial portion of said carrier being substantially equal to the length of the contacts in said connector plus the contacts in said plug plus the length of said conductors in said plug.

16. A system as set forth in claim 13 wherein said carrier is a cable; a jumper; said cable forming a part of said jumper.

17. A system as set forth in claim 16 wherein said jumper includes a plug connected to said cable; said plug having at least four contacts and at least four parallel conductors; said plug adapted to be removably received in said connector.

18. A system as set forth in claim 17 wherein said jumper includes a second connector connected to said cable on the opposite end from said plug; said second connector having at least four contacts.

19. A system as set forth in claim 18 wherein the length of said conductors on said substantial portion of said carrier being substantially equal to the sum of the length of the contacts in both of said connectors and the length of the contacts and conductors in both of said plugs.

20. A low cross talk electrical connector system comprising:

an electrical connector having at least two pairs of spaced apart electrical contacts thereby causing pair to pair cross talk when electrical signals are present on at least one of said pairs of said contacts;

a carrier; said carrier connected to said electrical connector; said carrier including at least four conductors connected to said contacts; said carrier including apparatus for substantially reducing pair to pair cross talk originating in said connector; said carrier including a fifth conductor; said fifth conductor connected to one of said four conductors and being adjacent to another of said four conductors for reducing signal loss and improving return loss.

21. A system as set forth in claim 20 wherein the reduction of the cross talk and signal loss is provided through the physical arrangement of said conductors on said carrier.

22. A system as set forth in claim 20 wherein at least one of said conductors is crossed over at least another of said conductors.

* * * * *